United States Patent Office 3,267,013
Patented August 16, 1966

3,267,013

ELECTROLYTIC DEPLATING PROCESS

Joseph S. Mathias, Riverton, N.J., and Walter O. Freitag, Conshohocken, Pa., assignors to Sperry Rand Corporation, New York, N.Y., a corporation of Delaware No Drawing. Filed Sept. 18, 1962, Ser. No. 224,534
2 Claims. (Cl. 204—143)

This invention relates to a deplating process. More particularly, this invention relates to the deplating of metallic films from a substrate. Still more particularly, this invention relates to the deplating of metallic films of chromium and gold from a substrate, such as a glass substrate, or other substrate.

In order to electrodeposit magnetic films, such as a thin ferromagnetic film of nickel-iron, on a substrate, such as an inert, non-conductive substrate, e.g. a glass substrate, it is necessary first to deposit upon the substrate a layer or film of conductive material. The materials used in some cases to provide a conductive layer or film on a glass substrate are chromium and gold. Usually, a layer or film of metallic chromium is deposited on the glass substrate and then a layer or film of gold is deposited upon the chromium layer. These layers of chromium and gold are deposited by vacuum evaporation, i.e. volatilization under a reduced pressure, and subsequent deposition of the respective metal in the desired sequence. Various other techniques, however, are known and are suitable for effecting the deposition of these materials on a substrate, e.g. cathode sputtering, electroless deposition.

After the deposition of the conductive layers of chromium and gold, a film of magnetic material, such as a nickel-iron alloy, is electrodeposited and the resulting substrate is then etched to give the desired magnetic film matrix. The etching process, however, does not affect the chromium-gold layers.

Heretofore the chromium-gold layers were not removed and the presence of the layers gave rise to difficulty in maintaining the magnetic matrix on the printed wiring layers associated therewith since it was difficult to align the wires accurately with the matrix. In addition, the electrical connection of the individual memory spots, the magnetic film matrix, provided by the chromium-gold layers resulted in undesirable capacitive effects.

Accordingly, it is an object of this invention to provide a method for the removal of chromium-gold layers from a substrate.

Another object of this invention is to provide a method for the removal of chromium-gold layers from a substrate, such as a glass substrate, or the equivalent, containing layers of chromium and gold deposited thereon together with a layer of magnetic material, such as a ferromagnetic layer or film of nickel-iron alloy covering only a portion of the chromium-gold layers.

How these and other objects of this invention are achieved will become apparent in the light of the accompanying disclosure.

It has now been discovered that layers of chromium and gold are removed or deplated from a substrate by bringing the substrate, containing layers of chromium and gold deposited thereon, into contact with an electrolyte containing a basic or alkaline acting alkali metal compound and an alkali metal cyanide dissolved therein and employing said substrate as an electrode, while passing current therethrough, to effect anodic dissolution of said layers of chromium and gold into said electrolyte.

The electrolyte employed to effect deplating in accordance with this invention comprises an aqueous solution containing a minor amount of an alkaline alkali metal compound, such as an alkali metal hydroxide, an alkali metal carbonate and an alkali metal phosphate, or mixtures thereof, e.g. sodium hydroxide, potassium hydroxide, sodium carbonate, potassium carbonate, sodium phosphate, potassium phosphate, and a minor amount of an alkali metal cyanide, such as potassium cyanide, sodium cyanide or mixtures thereof. Generally, an amount of alkaline acting alkali metal compound, such as sodium hydroxide, of about 5% by weight of the electrolyte solution, and an amount of alkali metal cyanide, such as sodium cyanide of about 5% by weight of the electrolyte, yields satisfactory results. Higher and/or lower concentrations of the alkaline acting alkali metal compound and/or the alkali metal cyanide, such as concentrations in the range 0.2–12% by weight, also yield satisfactory results.

The anodic deplating operation in accordance with this invention may be carried out at any suitable and convenient temperature, usually at about room temperature, e.g. 20° C. or higher, such as a temperature in the range 15–60° C., more or less. Also, any suitable voltage may be employed during the anodic deplating operation, such as a voltage in the range about 4–8 volts. Satisfactory results have been obtained by carrying out the anodic deplating operation at a voltage of 6 volts.

During the anodic deplating operation, particularly when deplating rather large areas of chromium-gold films, in order to assure that all of the chromium-gold layers are deplated without leaving behind on the substrate isolated areas, spots or islands of chromium-gold layers, as might arise due to uneven deplating of the substrate being treated with resulting loss in electrical contact to these islands, it is preferred that the substrate containing the chromium and gold layers be gradually lowered into the electrolyte solution or, vice versa, the level of the electrolyte solution gradually raised while in contact with the substrate, so that a fresh portion of the substrate being deplated is immersed or comes into contact with the electrolyte as fast as the chromium-gold layers on the immersed portion of the substrate goes into anodic solution.

The following is descriptive of the practice of this invention as directed to the preparation of a magnetic film matrix on a glass substrate, the magnetic film matrix covering underlying layers of gold and chromium. A suitable substrate, such as a glass substrate, is cleaned of dirt, dust, extraneous material, oil and grease and the like and there is deposited on the cleaned glass substrate by vacuum evaporation a layer of metallic chromium, such as a chromium layer having a thickness of about four microinches. Subsequently, also by vapor deposition, there is deposited on the chromium layer a layer of metallic gold also having a thickness of about four microinches.

The resulting substrate, now coated with the electrically conductive chromium-gold layers, is placed in a plating bath and there is plated or electrodedeposited thereon a thin, ferromagnetic film of a nickel-iron alloy having an iron content in the range 14–23% by weight, and having a thickness of about four microinches.

A suitable bath for effecting the electrodeposition of the ferromagnetic nickel-iron alloy has the composition shown in the accompanying Table I:

*Table I*

| Chemical | Formula | Grams Per Liter |
|---|---|---|
| Nickel Sulfate | $NiSO_4 \cdot 6H_2O$ | 218 |
| Ferrous Sulfate | $FeSO_4 \cdot 7H_2O$ | 3.6 to 6.0 |
| Boric Acid | $H_3BO_3$ | 2.5 |
| Saccharine | $C_6H_4SO_2NHCO$ | 0.8 |
| Sodium Lauryl Sulfate | $CH_3(CH_2)_{10}COSO_4Na$ | 0.4 |
| Sodium Hypophosphite | $NaH_2PO_2 \cdot H_2O$ | 0.08 to 0.4 |
| Sodium Chloride | $NaCl$ | 4.9 |

The electrodeposition or plating of the ferromagnetic nickel-iron alloy is conveniently carried out at room temperature using from 2 to 6 volts, usually a voltage in the range 2–3 volts, while maintaining the current density at about 6 ma./cm.$^2$. During the plating operation the pH of the bath may vary in the range from about 1.5 to about 3.4 and under these conditions a ferromagnetic film of nickel-iron alloy having a thickness in the range 800–1600 A. is deposited within about 1–2 minutes.

The resulting substrate, now coated with metallic chromium, metallic gold and a layer of nickel-iron alloy in this sequence from the surface of the substrate upward, is then etched with a suitable etching solution to develop or to produce the desired ferromagnetic film matrix of nickel-iron alloy on the substrate and uncovering a portion of the chromium-gold layers.

In carrying out the etching operation the ferromagnetic film of nickel-iron alloy is covered with a layer of photo-sensitive material, such as Kodak Photo Resist or Kodak Metal Etch Resist, and allowed to dry. The layer of photo-sensitive material is then exposed to light through a negative or mask.

Exposure to light renders components, such as resin, in the photo-sensitive material insoluble in developing solution. The photo-sensitive material on the substrate is then contacted or masked with developing solution and the soluble portions of the photo-sensitive material are washed away, thereby exposing certain portions of the nickel-iron alloy film. The thus-treated substrate is then etched by immersion in an etching solution, e.g. a 40% solution of ferric chloride at a temperature in the range from about 20° C. to about 40° C. The areas of the nickel-iron alloy film not protected by the remaining insoluble photo-sensitive material are dissolved in the etching solution and the gold underlayer is exposed.

Following the etching operation the exposed layers of chromium and gold, now no longer protected by an overlying layer of nickel-iron alloy, are removed from the substrate by gradually immersing the substrate into an anodic deplating bath comprising an aqueous solution containing 5% by weight sodium hydroxide and 5% by weight sodium cyanide. Employing the substrate as an anode, current is caused to flow through the deplating bath and the substrate to effect deplating or dissolution of the chromium-gold layers into the anodic deplating bath. The deplating operation for the removal of the gold-chromium layers which are unprotected by an overlying layer or film of the ferromagnetic nickel-iron alloy is carried out at any suitable temperature, such as room temperature, and employing a voltage of about 6 volts. The anodic deplating operation is carried out to remove all the unprotected gold-chromium layers from the substrate, leaving behind only that portion of the chromium-gold layers protected by an overlying layer of nickel-iron alloy as defined by the etched matrix, the ferromagnetic nickel-iron alloy being unaffected by the anodic deplating operation.

The anodic deplating operation is carried out such that the unprotected gold-chromium layers come into contact with the deplating solution substantially as fast as the immersed, unprotected layers of gold-chromium go into solution. This arrangement for immersion of the gold-chromium layers into the anodic deplating solution during the deplating operation is desirable to avoid discontinuity in the electrical conductivity of the gold-chromium layers to be removed which might result in electrically isolated portions of the gold-chromium layers, with consequent failure to deplate or dissolve these isolated portions from the substrate.

Following the anodic deplating operation there is recovered a substrate having the magnetic matrix of nickel-iron alloy as defined during the etching operation covering underlying layers of gold and chromium, the remaining portions of the substrate being substantially free of exposed gold-chromium layers.

As will be apparent to those skilled in the art in the light of the foregoing disclosure, many modifications, substitutions and alterations are possible in the practice of this invention without departing from the spirit or scope thereof.

The embodiments of the invention in which an exclusive property or privilege is claimed are defined as follows:

1. A process for removing from an inert, electrically nonconductive substrate films of metallic chromium and metallic gold deposited thereon, said substrate having said film of metallic chromium superimposed directly thereon and said film of metallic gold being superimposed directly on said film of metallic chromium and an electrodeposited metallic magnetic film having a thickness in the range 800–1600 A. and consisting essentially of nickel and iron covering only a portion of said film of metallic gold, which comprises introducing said substrate containing the films of chromium, gold and nickel and iron deposited thereon into an aqueous electrolyte at a temperature in the range of from about 15° C. to about 60° C. consisting essentially of an alkaline acting alkali metal compound selected from the group consisting of alkali metal hydroxides, alkali metal carbonates and alkali metal phosphates in an amount in the range 0.2–12%, and an alkali metal cyanide in the range 0.2–12% dissolved therein and, while employing the thus-coated substrate as an electrode, passing current through the thus-coated substrate to effect anodic dissolution of said films of metallic gold and metallic chromium from the area of said substrate not covered by said metallic magnetic film of nickel and iron, said metallic magnetic film and the films of metallic gold and metallic chromium directly underlying said metallic magnetic film remaining undissolved and deposited on said substrate, the thus-coated substrate being introduced into said electrolyte such that anodic dissolution of said films of gold and chromium is effected substantially as soon as said films of gold and chromium come into contact with said electrolyte.

2. A process for removing from a glass substrate films of metallic chromium and metallic gold deposited thereon, said glass substrate having said film of metallic chromium superimposed directly thereon as a continuous film and said film of metallic gold being superimposed directly onto said film of metallic chromium as a continuous film so as to substantially completely cover the film of metallic chromium and a ferromagnetic film consisting essentially of nickel and iron having a thickness in the range from about 800 A. to about 1600 A. electrodeposited upon said film of metallic gold and covering only a portion of said gold film, which comprises introducing said substrate containing the films of chromium, gold and iron and nickel deposited thereon into an aqueous electrolyte at a temperature in the range from about 15° C. to about 60° C. consisting essentially of 5% by weight sodium cyanide and 5% by weight sodium hydroxide dissolved therein, and while employing the thus-coated substrate as an electrode, passing current through said electrode to effect anodic dissolution of said films of metallic chromium and metallic gold into said electrolyte, that portion of the films of metallic chromium and metallic gold covered by and directly beneath said ferromagnetic film containing nickel and iron remaining undissolved.

References Cited by the Examiner

UNITED STATES PATENTS

| | | | |
|---|---|---|---|
| 2,385,198 | 9/1945 | Engle | 204—143 |
| 2,722,511 | 11/1955 | Butler et al. | 204—143 |
| 2,739,112 | 3/1956 | Ferguson | 204—146 |
| 2,799,636 | 7/1957 | MacLachlan | 204—143 |
| 2,944,926 | 7/1960 | Gaiser | 204—143 |

(Other references on following page)

FOREIGN PATENTS 799,245 8/1958 Great Britain.

OTHER REFERENCES

"Modern Gold Plating" (Product Finishing), Kushner. January 1942, pp. 50–56.

"Plating," Mathur et al., February 1961, pp. 170–172 (page 170 relied on).

JOHN H. MACK, *Primary Examiner.*

R. L. GOOCH, *Examiner.*

R. MIHALEK, *Assistant Examiner.*